US011121061B2

United States Patent
Joshi et al.

(10) Patent No.: US 11,121,061 B2
(45) Date of Patent: Sep. 14, 2021

(54) COOLING CHIP STRUCTURES HAVING A JET IMPINGEMENT SYSTEM AND ASSEMBLY HAVING THE SAME

(71) Applicant: Toyota Motor Engineering & Manufacturing North America, Inc., Plano, TX (US)

(72) Inventors: Shailesh N. Joshi, Ann Arbor, MI (US); Naoya Take, Canton, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 301 days.

(21) Appl. No.: 16/196,780

(22) Filed: Nov. 20, 2018

(65) Prior Publication Data
US 2020/0161217 A1 May 21, 2020

(51) Int. Cl.
*H01L 23/473* (2006.01)
*H01L 21/48* (2006.01)
*H01L 23/498* (2006.01)

(52) U.S. Cl.
CPC ...... *H01L 23/4735* (2013.01); *H01L 21/4871* (2013.01); *H01L 23/49838* (2013.01)

(58) Field of Classification Search
CPC ............. H01L 23/4735; H01L 21/4871; H01L 23/49838
See application file for complete search history.

(56) References Cited

U.S. PATENT DOCUMENTS

| | | | |
|---|---|---|---|
| 7,928,565 B2 | 4/2011 | Brunschwiler et al. | |
| 8,074,706 B2 | 12/2011 | Su et al. | |
| 8,199,505 B2 | 6/2012 | Dede | |
| 9,247,679 B2 | 1/2016 | Joshi et al. | |
| 9,803,938 B2 | 10/2017 | Joshi | |
| 2005/0211417 A1* | 9/2005 | Upadhya | F28D 15/0266 165/80.4 |
| 2008/0041574 A1* | 2/2008 | Arik | H01L 23/4735 165/287 |
| 2010/0097760 A1 | 4/2010 | Azar et al. | |
| 2014/0096387 A1 | 4/2014 | Campbell et al. | |
| 2018/0026416 A1* | 1/2018 | Kasahara | H01S 3/0407 372/35 |
| 2018/0166359 A1* | 6/2018 | Fukuoka | H01L 23/3738 |

* cited by examiner

*Primary Examiner* — Fernando L Toledo
*Assistant Examiner* — Neil R Prasad
(74) *Attorney, Agent, or Firm* — Dinsmore & Shohl LLP

(57) ABSTRACT

Embodiments described herein generally relate to an electronics assembly that includes a semiconductor device, a substrate layer, a first mesh layer and a second mesh layer. Jet channels that have a first inner diameter are disposed within the substrate layer. The first mesh layer includes a first plurality of pores that have a perimeter opening. The second mesh layer includes a second plurality of pores that have a second inner diameter. The jet channels, the first and the second plurality of pores are concentric to create a fluid path for a fluid to impinge a first device surface of the semiconductor device. The second inner diameter is smaller than the perimeter opening and the first inner diameter of the substrate layer such that a cooling fluid velocity increases when flowing from the substrate layer through the second mesh layer.

20 Claims, 8 Drawing Sheets

COOLING CHIP STRUCTURES HAVING A JET IMPINGEMENT SYSTEM AND ASSEMBLY HAVING THE SAME

TECHNICAL FIELD

The present disclosure generally relates to cooling structures and, more specifically, to cooling structures having jet impingement features to cool heat generating components.

BACKGROUND

Heat sink devices may be coupled to a heat-generating device, such as a power electronics device, to remove heat and lower the maximum operating temperature of the heat-generating device. Cooling fluid may be used to receive heat generated by the heat-generating device by convective thermal transfer and remove such heat from the heat-generating device. For example, cooling fluid may be directed adjacent to a semiconductor-cooling chip to remove heat from the heat-generating device.

However, as power electronics are designed to operate at increased power levels and generate increased corresponding heat flux due to the demands of certain electronic devices, conventional heat sinks may be unable to adequately remove the heat flux to effectively lower the operating temperature of the power electronics to acceptable temperature levels.

SUMMARY

In one embodiment an assembly includes an electrode, a substrate layer, a first mesh layer and a second mesh layer. The substrate layer is spaced apart from the electrode. The substrate layer further includes a first substrate layer surface and a second substrate layer surface opposite the first substrate layer surface. One or more jet channels are disposed within the substrate layer between the first substrate layer surface and the second substrate layer surface. Each jet channel of the one or more jet channels has a first opening at the first substrate layer surface and a second opening at the second substrate layer surface. The first mesh layer is positioned between the electrode and the substrate layer. The first mesh layer includes a first plurality of pores. Each one of the first plurality of pores is concentric with a corresponding second opening of the jet channels. A second mesh layer is positioned between the electrode and the first mesh layer. The second mesh layer includes a second plurality of pores. Each one of the second plurality of pores are concentric with a corresponding one of the first plurality of pores.

In another embodiment, an electronics assembly includes a semiconductor device and a cooling chip. The cooling chip includes a substrate layer, a first mesh layer and a second mesh layer. The substrate layer further includes a first substrate layer surface and a second substrate layer surface opposite the first substrate layer surface, and one or more jet channels disposed within the substrate layer between the first substrate layer surface and the second substrate layer surface. Each jet channel of the one or more jet channels has a first opening at the first substrate layer surface and a second opening at the second substrate layer surface. The first mesh layer is positioned between the semiconductor device and the substrate layer. The first mesh layer incudes a first plurality of pores. Each one of the first plurality of pores are concentric with a corresponding second opening of the jet channels. The second mesh layer is positioned between the semiconductor device and the first mesh layer. The second mesh layer includes a second plurality of pores. Each one of the second plurality of pores is concentric with a corresponding one of the first plurality of pores.

In yet another embodiment, an assembly includes an electrode, a substrate layer, a first mesh layer, and a second mesh layer. The electrode includes a first electrode surface and an opposite second electrode surface. The substrate layer is spaced apart from the first electrode. The substrate layer includes a first substrate layer surface, a second substrate layer surface opposite the first substrate layer surface, and one or more jet channels disposed within the substrate layer between the first substrate layer surface and the second substrate layer surface. Each jet channel of the one or more jet channels has a first opening at the first substrate layer surface and a second opening at the second substrate layer surface. The first mesh layer is positioned between the electrode and the substrate layer. The first mesh layer has a first plurality of pores. Each one of the first plurality of pores are concentric with a corresponding second opening of the jet channels. The second mesh layer has a mesh upper surface and a mesh lower surface, the mesh upper surface has a plurality of spacers disposed thereon, the second mesh layer is coupled to the first mesh layer, and the plurality of spacers is coupled to the electrode. The second mesh layer includes a second plurality of pores. Each one of the second plurality of pores are concentric with a corresponding one of the first plurality of pores.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein generally relate to electronics assemblies coupled to a cooling structure having two mesh layers that include a fluid flow path. The cooling structure includes a substrate layer having one or more jet channels that have a first inner diameter disposed within. The first mesh layer includes a first plurality of pores that have a perimeter having a perimeter opening. The second mesh layer includes a second plurality of pores that have a second inner diameter. The first plurality of pores is concentric with the jet channels and the second plurality of pores. Further, the second inner diameter of the plurality of second pores is smaller than the perimeter opening of the plurality of first pores and the second inner diameter is smaller than the first inner diameter. As such, this arrangement of concentric diameters that become smaller create the fluid flow path such that when a fluid is directed through the flow path, the velocity of the fluid increases without influencing a pressure of the system.

Figure 1:
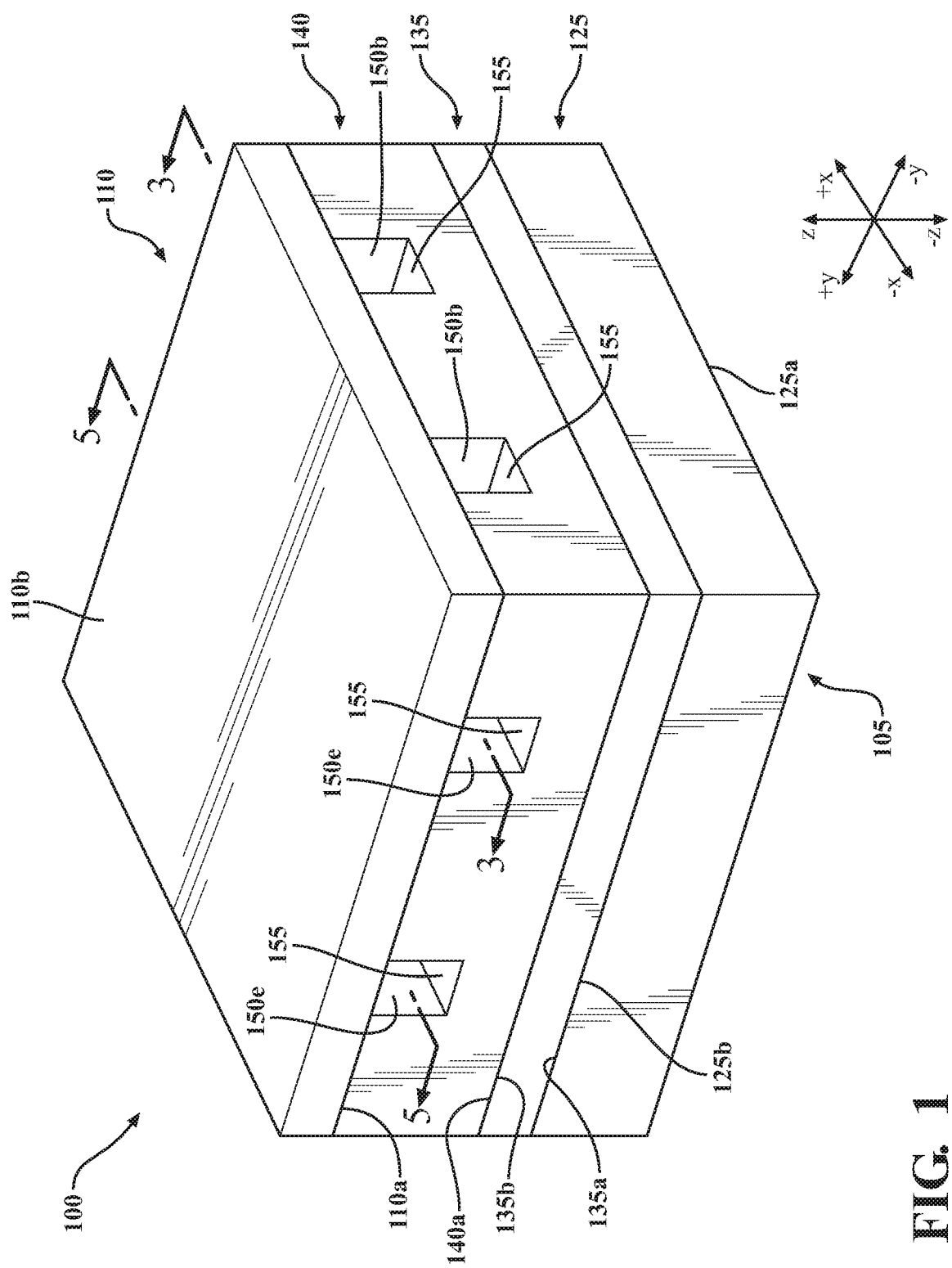
FIG. 1 schematically depicts a perspective view of an example electronics assembly coupled to a cooling structure having two mesh layers according to one or more embodiments shown and described herein.

FIG. 1 depicts an example electronics assembly 100. An axial length of the electronics assembly 100 is indicated by the term "longitudinal direction" which refers to the forward-rearward direction of the assembly (i.e., in the +/−X-direction depicted in FIG. 1). The width of the electronics assembly 100 is indicated by the term "lateral direction" which refers to the cross direction (i.e., in the +/−Y-direction depicted in FIG. 1), and is transverse to the longitudinal direction. The height of the electronics assembly 100 is indicated by the term "vertical direction" which refers to the upward-downward direction of the assembly (i.e., in the +/−Z-direction depicted in FIG. 1).

It should be noted that for ease of describing and understanding the present disclosure, the elements with the "a" designation are separate from the elements with the "b" designation and, as such, unless stated, remain separate whether by position on the cooling chip structure 105 and/or separated by mechanical device.

Figure 2A:
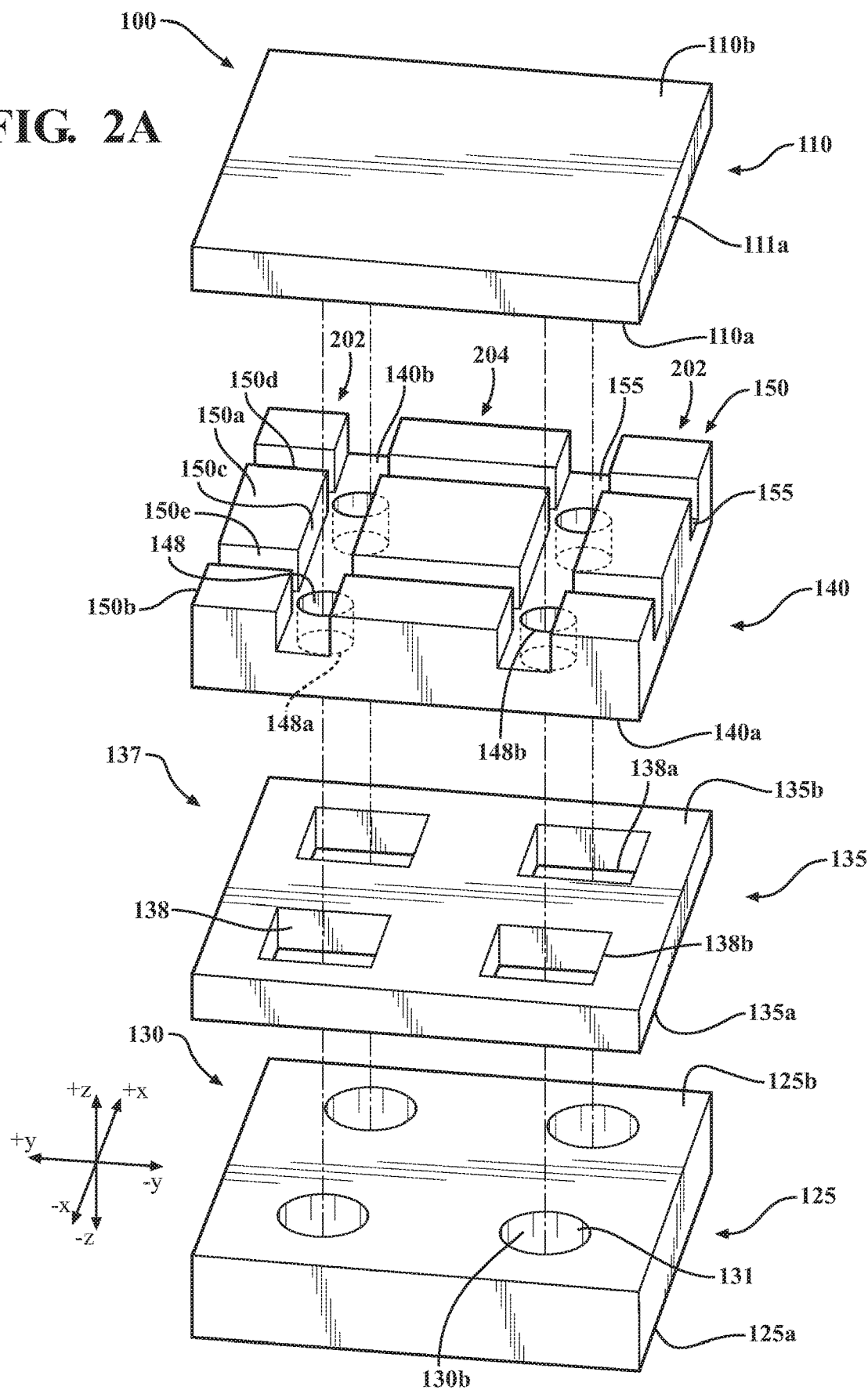
FIG. 2A schematically depicts a perspective exploded view of an example assembly coupled to a cooling structure having two mesh layers according to one or more embodiments shown or described herein.
Figure 2B:
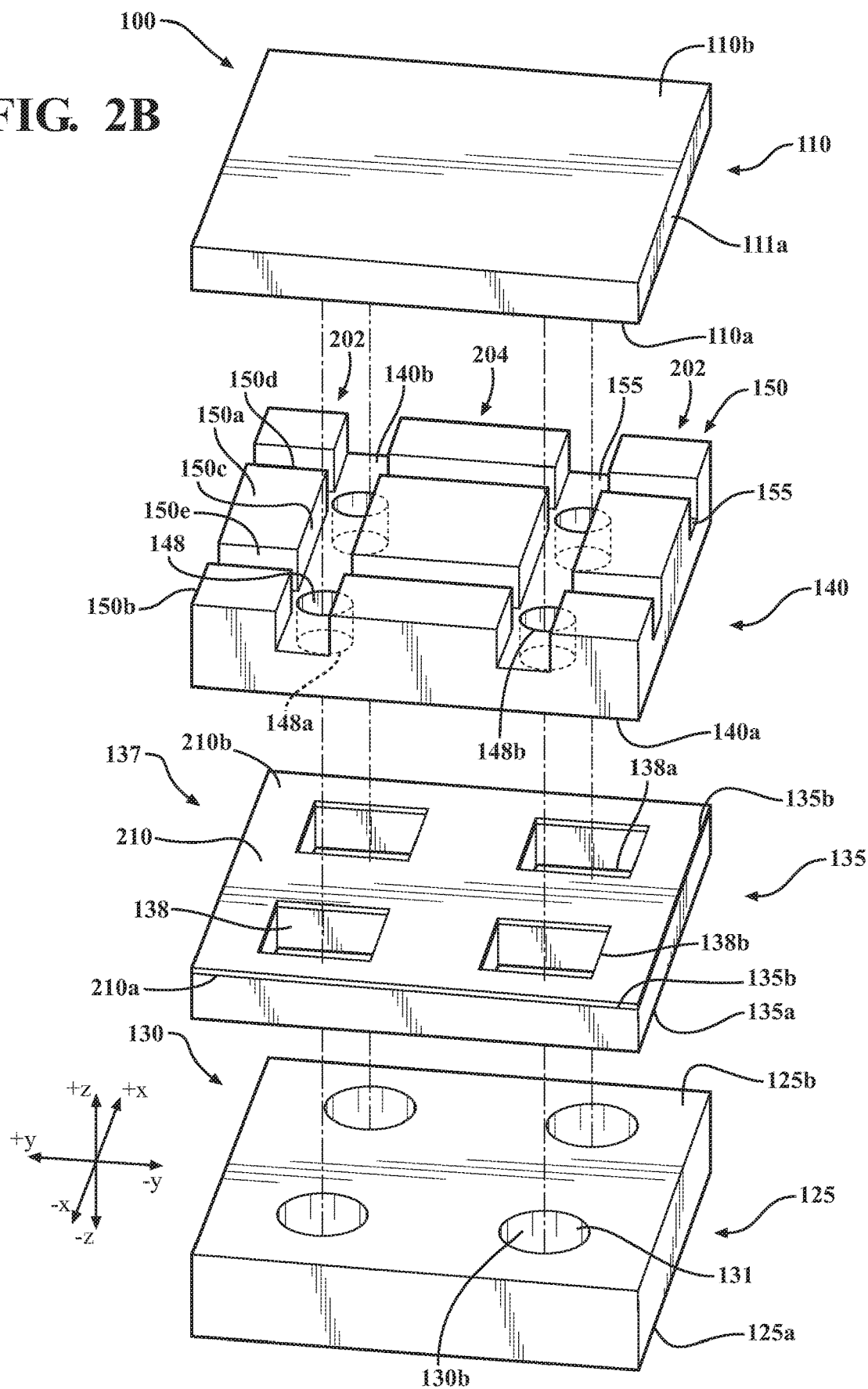
FIG. 2B schematically depicts a perspective exploded view of an example assembly coupled to a cooling structure having two mesh layers via a solder layer according to one or more embodiments shown or described herein.
Figure 3:
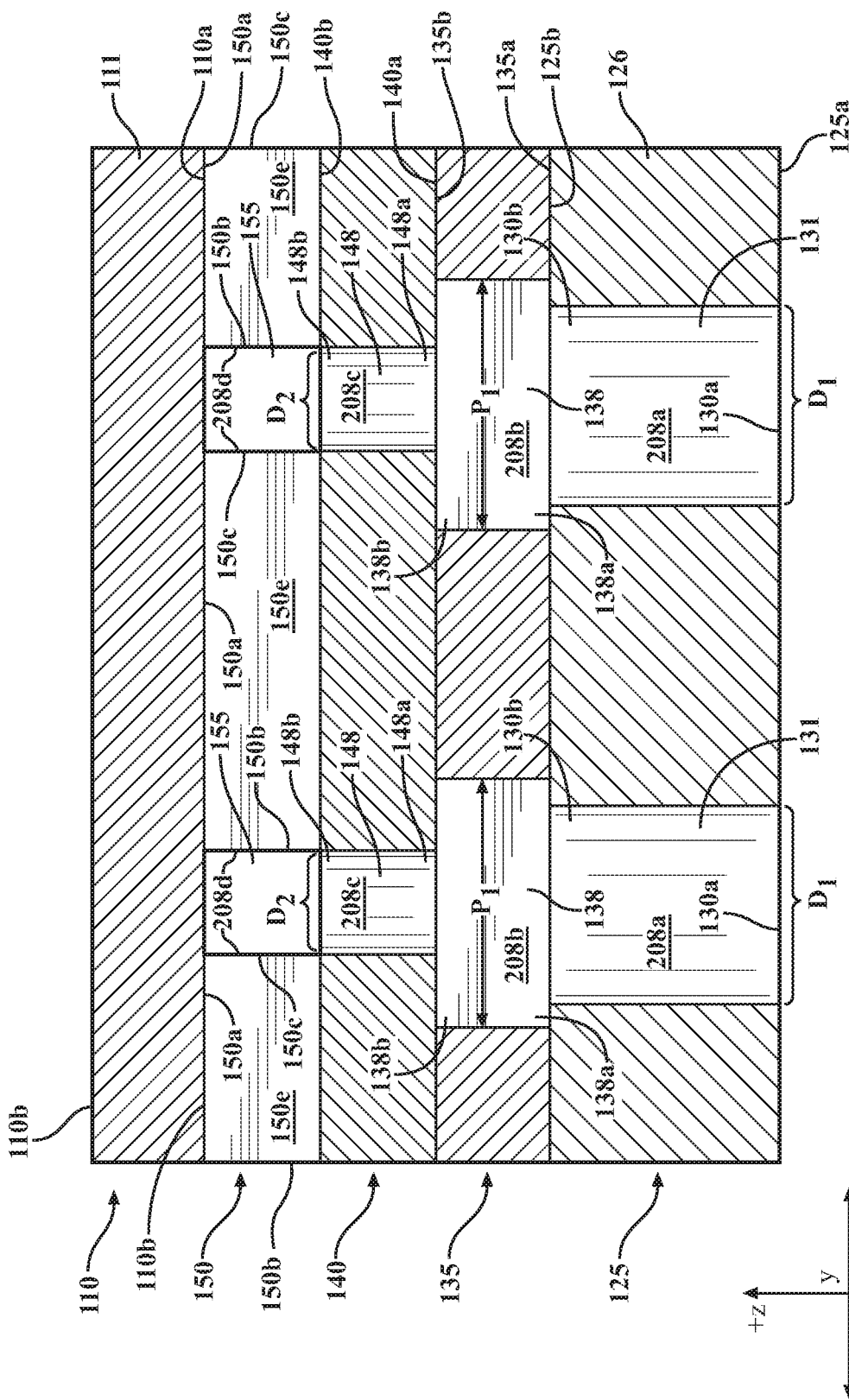
FIG. 3 schematically illustrates an offset cross-sectional view of FIG. 1 taken from line 3-3 according to one or more embodiments shown or described herein.
Figure 4:
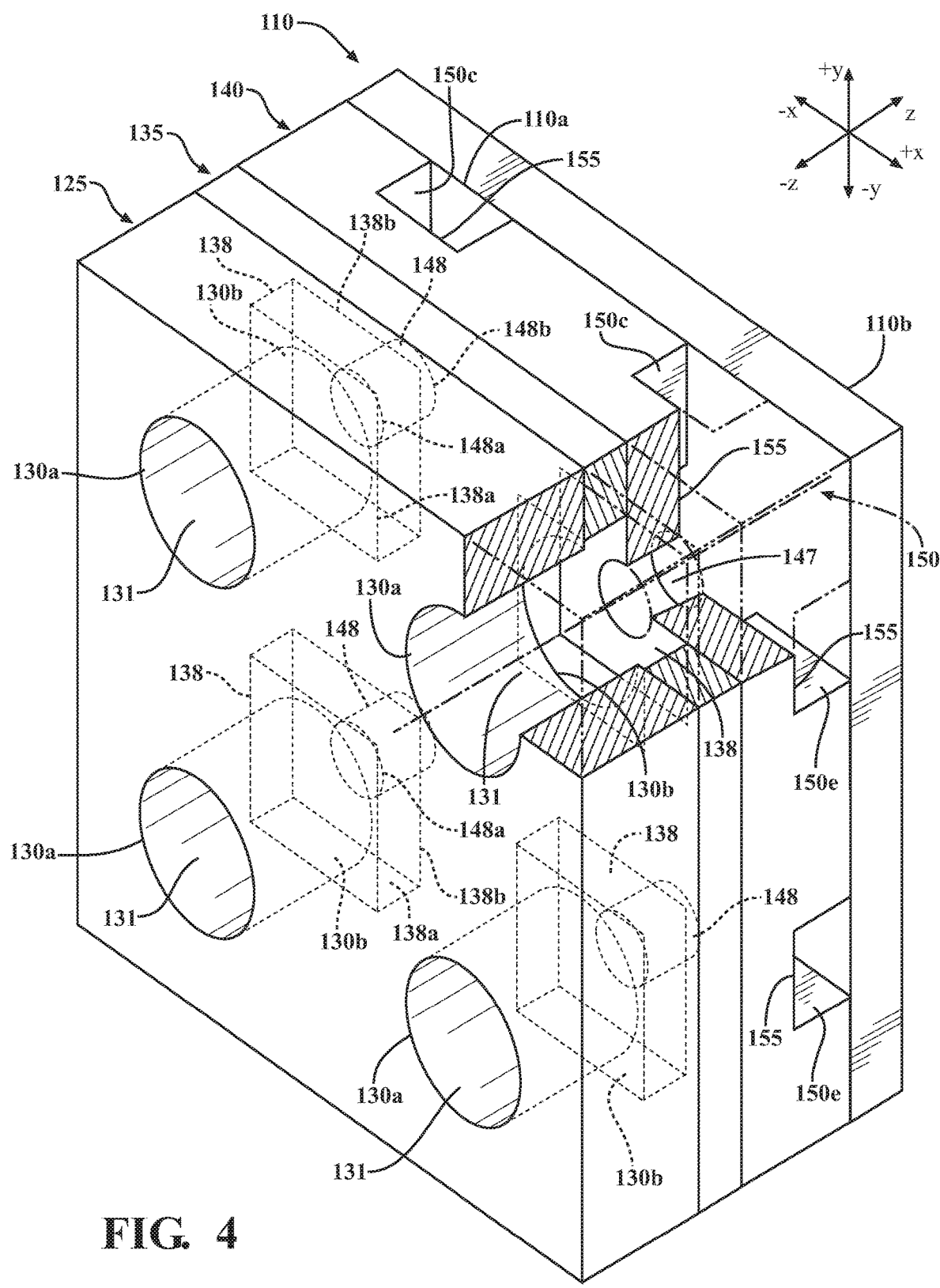
FIG. 4 schematically depicts a perspective bottom view of the electronics assembly coupled to the cooling structure having two mesh layers of FIG. 1 according to one or more embodiments described herein.
Figure 5:
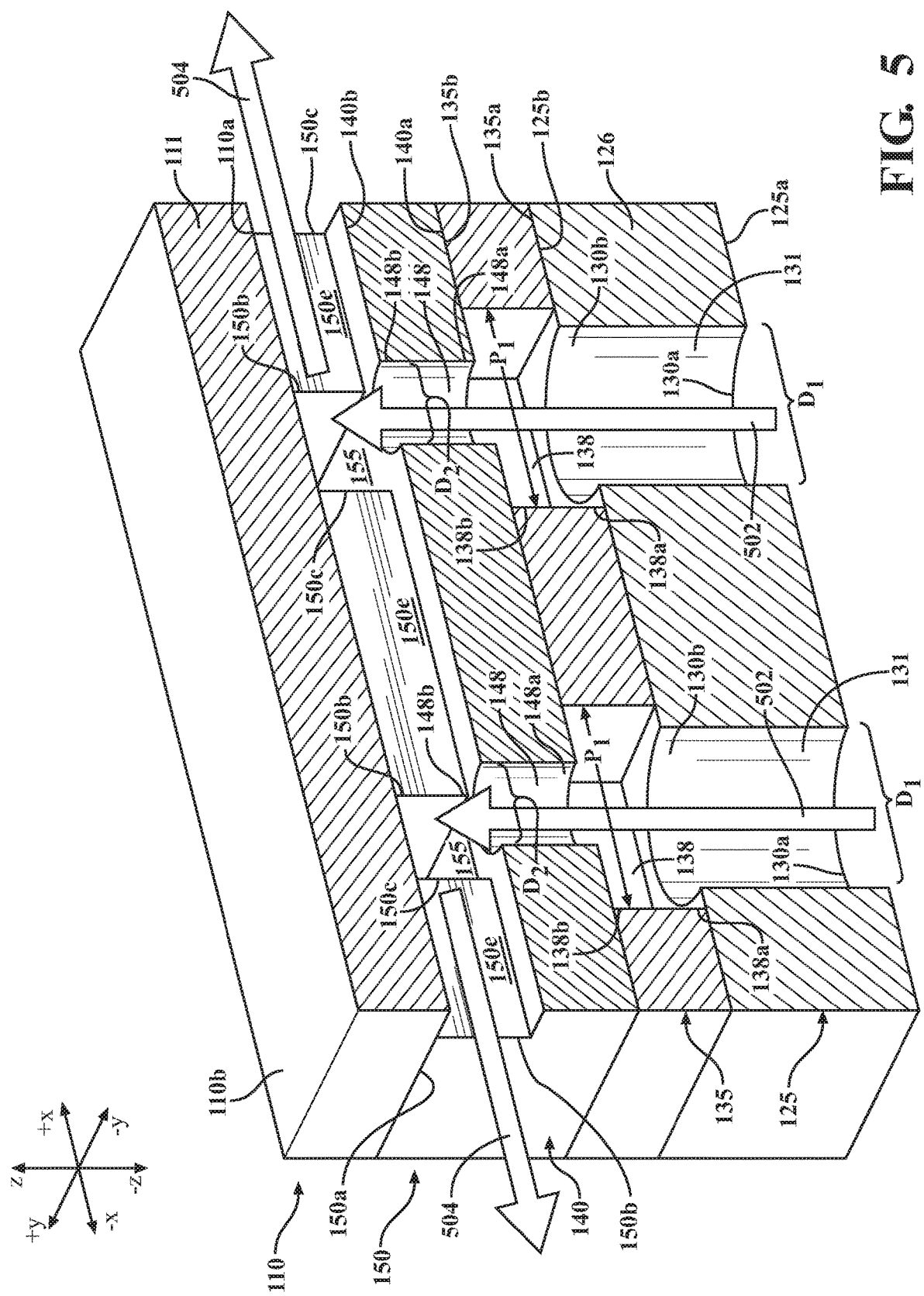
FIG. 5 schematically illustrates a perspective cross-sectional view of FIG. 1 taken from line 5-5 according to one or more embodiments shown or described herein.

Referring now to FIGS. 1-5, FIG. 1 depicts a perspective view of the example electronics assembly 100 and FIGS. 2A-2B depict different embodiments in a perspective exploded view of the electronics assembly 100. Further, FIG. 3 depicts an offset cross-section view of the electronics assembly 100 along line 3-3 of FIG. 1, FIG. 4 depicts a perspective bottom view of the electronics assembly 100, and FIG. 5 depicts a perspective cross-section view of the electronics assembly 100 along line 5-5 of FIG. 1. As depicted in FIGS. 1-5, the electronics assembly 100 includes a cooling chip structure 105 and a semiconductor device 110. The semiconductor device 110 includes a first device surface 110a and a second device surface 110b. The cooling chip structure 105 includes a substrate layer 125, a first mesh layer 135, and a second mesh layer 140. The second mesh layer 140 further includes a second mesh layer lower surface 140a and a second mesh layer upper surface 140b. A plurality of spacers 150 extend from the second mesh layer upper surface 140b. The plurality of spacers 150 may be disposed on or be integral with the second mesh layer 140, as discussed in greater detail herein.

In some embodiments, the substrate layer 125 is electrically coupled to the semiconductor device 110 and/or to a connected power source to facilitate electrical power transfer between the semiconductor device 110 and the external power source. An illustrative example of the substrate layer 125 being electrically coupled to the connected power source may be when the substrate layer 125 is electrically coupled to a vehicle power system (not shown). It should be understood that an electrode may be included in the semiconductor device 110 and/or the electrode may be used instead of the semiconductor device 110. It should also be understood that the electrode of the semiconductor device 110 described herein may be a single electrode (e.g., a sheet of electrically conductive material) or a patterned electrically conductive layer providing electrical connections for multiple signals (e.g., patterns defined by electrically conductive traces).

The substrate layer 125 includes a first substrate layer surface 125a spaced apart and opposite a second substrate layer surface 125b, and one or more jet channels 130 (FIG. 2A) disposed within the substrate layer 125 extending between the first substrate layer surface 125a and the second substrate layer surface 125b. As such, the one or more jet channels 130 extend the length of a thickness between the first substrate layer surface 125a and the second substrate layer surface 125b in the vertical direction (i.e. in the +/−Z direction). Each jet channel 131 of the one or more jet channels 130 has a first opening 130a at the first substrate layer surface 125a and a second opening 130b at the second substrate layer surface 125b. The one or more jet channels 130 have a first inner diameter D1 (FIG. 3).

In the embodiments depicted in FIGS. 1-5, the first inner diameter D1 may be uniform between each jet channel 131 of the one or more jet channels 130. Further, the one or more jet channels 130 may have a uniform first inner diameter D1 extending from the first opening 130a to the second opening 130b in the vertical direction (i.e., in the +/−Z direction). In some embodiments, the first inner diameter D1 may not be uniform between each jet channel 131 of the one or more jet channels 130 and some jet channels 131 may have varying first inner diameters D1. For example, a number of the jet channels 131 may have the first inner diameter D1 while other jet channels 131 have a different inner diameter. In still other embodiments, the first inner diameter D1 of the one or more jet channels 130 extending from the first opening 130a to the second opening 130b in the vertical direction may vary. That is, the first inner diameter D1 may be larger near the first opening 130a with respect to the second opening 130b. In this embodiment, it should be appreciated that a fluid velocity may increase as the fluid flows from the larger inner diameter near the first opening 130a to the smaller diameter at the second opening 130b.

The one or more jet channels 130 extend in the vertical direction (i.e., in the +/−Z direction) within the cooling chip structure 105 to provide fluid flow paths for a cooling fluid, such as, for example, a dielectric cooling fluid. The cooling fluid flows from the first opening 130a of the one or more jet channels 130 to the first device surface 110a of the semiconductor device 110 through the first and second mesh layers 135, 140, as described in greater detail below, such that heat created by the semiconductor device 110 may be removed. Non-limiting cooling fluids include dielectric cooling fluids such as R-245fa and HFE-7100. Other dielectric cooling fluids may be utilized. Further, other electrically conductive cooling fluids such as water may be used if the surfaces that define the fluid path is coated with an isolating material such as aluminum oxide. The type of cooling fluid chosen may depend on the operating temperature of the heat generating devices to be cooled.

The substrate layer 125 of the electronics assembly 100 may include a substrate material 126 (FIG. 3), such as a high temperature co-fired ceramic (HTCC) material, a low temperature co-fired ceramic (LTCC) material, FR-4, or the like. It should be appreciated that the high temperature substrate material 126 of the substrate layer 125, such as HTCC, may be compositionally configured to withstand a temperature greater than or equal to about an operating temperature of the semiconductor device 110 without substantially deforming or otherwise deteriorating. The substrate material may be an electrically and thermally conductive material, such as a metal or metal alloy. Example metals include, but are not limited to, copper (Cu), aluminum (Al), gold (Au), nickel (Ni), tin (Sn), silver (Ag), and alloys thereof. The substrate material 126 may also be a semiconductor material, for example, without limitation Si, SiC, GaN, AN, BN, diamond, or the like.

Still referring to at least FIGS. 1-5, in some embodiments, the semiconductor device 110 may include, without limitation, a wide bandgap semiconductor device. As non-limiting examples, a semiconductor device material 111 (FIG. 3) may include, without limitation, wide bandgap materials such as SiC, GaN, AN, BN, diamond, and/or the like. As a non-limiting example, the semiconductor device material 111 may be any semiconductor material including a bandgap of about 2.2 eV or more. In other embodiments, the semiconductor device material 111 may include any semiconductor material, such as Si. In some embodiments, the semiconductor device 110 may be an insulated-gate bi-polar transistor ("IGBT"), a metal-oxide-semiconductor field-effect transistor ("MOSFET"), or any other semiconductor device. Further, as a non-limiting example, the semiconductor device 110 may operate at temperatures between about 250° C. and about 350° C. It should be understood that other operation temperatures are possible. The substrate layer 125 may be a printed circuit board, another semiconductor device, an electrode, a wire or any material for bonding to a semiconductor device 110.

As depicted in FIGS. 1-5, the first device surface 110a of the semiconductor device 110 is generally positioned towards, in contact with, and/or coupled to the second mesh layer 140 by the plurality of spacers 150. In some embodiments, the semiconductor device 110 may include a discrete metal layer (not shown) having a first metal layer surface (not shown) offset by a thickness opposite a second metal layer surface (not shown) that is bonded to the first device surface 110a. In other embodiments, the semiconductor device 110 may include a metallization layer (not shown) having a thickness that is deposited onto the first device surface 110a using any known or yet to be developed deposition methods. In some embodiments, the second mesh layer 140 may be coupled to the first device surface 110a by the discrete metal layer or the metallization layer (e.g., bonding the discrete metal layer or the metallization layer to the second mesh layer 140). Moreover, in still other embodiments, additional component layers may be positioned between the semiconductor device 110 and the second mesh layer 140 of the cooling chip structure 105.

As depicted in FIGS. 2A-5, the first mesh layer 135 of the electronics assembly 100 is generally planar having a plurality of pores 137 extending therethrough, as described in greater detail herein. The first mesh layer 135 is positioned between the second mesh layer 140 and the substrate layer 125. The first mesh layer 135 may include a first mesh layer lower surface 135a offset by a thickness and opposite a first mesh layer upper surface 135b. The first mesh layer lower surface 135a may be directly bonded to the second substrate layer surface 125b of the substrate layer 125. The first mesh layer lower surface 135a may be coupled directly to the second substrate layer surface 125b. In some embodiments, the first mesh layer lower surface 135a may be coupled to the second substrate layer surface 125b by a second plurality of spacers and/or by a first plurality of elongated members.

With reference still to FIGS. 2A-5, the first mesh layer 135 may be a material having one or more metals. For example, the first mesh layer 135 may include copper (Cu), aluminum (Al) gold (Au), nickel (Ni), tin (Sn), silver (Ag), or any metal, alloy or the like. The material is preferably an electrically and thermally conductive material such that electrical energy and thermal energy may be freely communicated between the semiconductor device 110 and the substrate layer 125. Further, the first mesh layer 135 may be formed from one or more layers of material. The first mesh layer 135 may be manufactured using, for example, electroforming, 3D printing, and/or the like.

With reference still to the embodiments of FIGS. 2A-5, the first mesh layer lower surface 135a may be bonded to the second substrate layer surface 125b to provide a mechanical, electrical, thermal joint, and/or the like between the substrate layer 125 and the first mesh layer 135. In some embodiments, the first mesh layer lower surface 135a may be bonded to the second substrate layer surface 125b via the first plurality elongated members (not shown) to provide a mechanical, electrical, thermal joint, and/or the like between the substrate layer 125 and the first mesh layer 135. The bonds between the substrate layer 125 and the first mesh layer 135 may be formed through one of a variety of techniques, such as solder reflow, wave soldering, laser soldering, ultrasonic bonding, thermosonic bonding, and/or the like.

The first plurality of pores 137 extend in the vertical direction (i.e., in the +/−Z direction) between the first mesh layer lower surface 135a and the first mesh layer upper surface 135b. In some embodiments, the first plurality of pores 137 in the first mesh layer 135 may have a shape defined by a rectangle. However, the shape of the first plurality of pores 137 may be any closed contoured regular shape such as a square, circle, rectangle, triangle, diamond, hexagon, or the like. In some embodiments, the first plurality of pores 137 may be any irregular shape. Additionally, the quantity and location of the first plurality of pores 137 within the first mesh layer 135 may be controlled depending on several factors, such as, for example, the amount of cooling needed, the velocity of the cooling fluid, and/or the like.

Referring again to FIGS. 1-5, in some embodiments, each pore 138 of the first plurality of pores 137 has a first inlet opening 138a and a first outlet opening 138b. The first inlet opening 138a is positioned adjacent to the substrate layer 125 while the first outlet opening 138b is positioned adjacent to the second mesh layer 140. The first plurality of pores 137 has a perimeter having a perimeter opening P1.

In the embodiments depicted in FIGS. 2A-5, the perimeter opening P1 may be uniform between each pore 138 of the first plurality of pores 137. Further, the first plurality of pores 137 may have a uniform perimeter opening P1 and a perimeter extending across the first mesh layer upper surface 135b and the first mesh layer lower surface 135a such that the rectangular shape or perimeter is maintained or uniform from the first inlet opening 138a to the first outlet opening 138b in the vertical direction (i.e. in the +/−Z direction). In other embodiments, the perimeter and/or perimeter opening P1 may not be uniform between each pore 138 of the first plurality of pores 137 and that some pores 138 of the first plurality of pores 137 may have varying perimeters and/or perimeter openings P1. That is, some pores 138 may have varying perimeters and/or perimeter openings P1 with respect to the other pores 138. In still other embodiments, the perimeter and/or perimeter opening P1 of first plurality of pores 137 extending from the first inlet opening 138a to the first outlet opening 138b in the vertical direction (i.e., in the +/−Z direction) may vary. That is, the perimeter and/or perimeter opening P1 may be larger near the first inlet opening 138a with respect to the first outlet opening 138b.

Still referring again to the embodiments in FIGS. 2A-5, the second mesh layer 140 of the electronics assembly 100 is generally planar having a second plurality of pores 147 extending therethrough, as described in greater detail herein. The second mesh layer 140 is positioned between the semiconductor device 110 and the first mesh layer 135. The second mesh layer 140 may include the second mesh layer lower surface 140a offset by a thickness and opposite the second mesh layer upper surface 140b. The plurality of spacers 150 may be a part of or integrally formed from the second mesh layer 140, as discussed in greater detail herein. In particular, the plurality of spacers 150 extend from the second mesh layer upper surface 140b in the vertical direction (i.e. the +/−Z direction). As such, in some embodiments, the second mesh layer 140 may be coupled to the semiconductor device 110 by the plurality of spacers 150 being directly bonded to or in contact with the discrete metal layer or the metallization layer of the semiconductor device 110.

Referring now to the embodiment depicted in FIGS. 2A and 5, the second mesh layer 140 may be directly bonded to the first mesh layer 135. In particular, the second mesh layer lower surface 140a of the second mesh layer 140 may be directly bonded to the first mesh layer upper surface 135b of the first mesh layer 135.

Referring now to the embodiment depicted in FIG. 2B, a perspective exploded view of the example electronics assembly 100 is coupled to a cooling structure having a solder layer 210 thereon. That is, the solder layer 210 may be deposited onto the first upper mesh layer surface 135b of the first mesh layer 135. The solder layer 210 may generally couple the first mesh layer 135 to the second mesh layer 140 in embodiments. That is, the solder layer 210 may provide a mechanical joint, an electrical joint, a thermal joint, and/or the like between the first mesh layer 135 and the second mesh layer 140. As such, the solder layer 210 has a thickness that spaces the first mesh layer 135 apart from the second mesh layer 140 in the vertical direction (i.e., in the +/−Z direction). The solder layer 210 may separate the first layer 135 from the second layer 140 similar to a mechanical device such as a post or a frame. In some embodiments, the solder layer 210 is deposited onto the first upper mesh layer surface 135b of the first mesh layer 135 and is in contact with the second mesh layer lower surface 140a of the second mesh layer 140 around a perimeter or at any location that does not block the first or second plurality of pores 137, 147. In other embodiments, the solder layer 210, while depicted in the electronics assembly 100 having a substrate layer 125, the solder layer 210 may be used regardless of whether the electronics assembly 100 includes a substrate layer 125 and/or a manifold layer 160.

Now referring back to the embodiments in FIGS. 2A-5, the second mesh layer 140 may be a material having one or more metals. For example, the second mesh layer 140 may include Cu, Al, Au, Ni, Sn, Ag, or any metal, alloy or the like. The material is preferably an electrically and thermally conductive material such that electrical energy and thermal energy may be freely communicated between the semiconductor device 110 and the substrate layer 125. Further, the second mesh layer 140 may be formed from one or more layers of material. The second mesh layer 140 may be manufactured using, for example, electroforming, diffusion bonding, 3D printing, and/or the like.

With reference still to the embodiments depicted in FIGS. 2A-5, the plurality of spacers 150 may be formed from the second mesh layer 140 and extend from the second mesh layer upper surface 140b towards the semiconductor device 110 in the vertical direction (i.e., in the +/−Z direction). As such, the plurality of spacers 150 may be etched or machined from the second mesh layer 140. That is, the plurality of spacers 150 may be integrally formed from the second mesh layer 140. The plurality of spacers 150 traverse the second mesh layer upper surface 140b. As such, the plurality of spacers 150 extend in the both a lateral direction (i.e. in the +/−Y direction) and a longitudinal direction (i.e. in the +/−X direction) across the second mesh layer upper surface 140b to form a grid pattern. The plurality of spacers 150 is offset from both the first plurality of pores 137 and the second plurality of pores 147 so as to not block the flow of the cooling fluid, or the fluid path as discussed in further detail herein. Each one of the plurality of spacers 150 generally have an upper surface 150a, a pair of opposing sidewalls 150b, 150c, and a pair of opposing end walls 150d, 150e so to have planar surfaces. The planer surfaces (i.e. the pair of opposing sidewalls 150b, 150c and the pair of opposing end walls 150d, 150e) of each one of the plurality of spacers 150 have a plurality of passages or a plurality of channels 155 therebetween. As such, the plurality of channels 155 may be etched or machined so to transverse the second mesh layer upper surface 140b in both the lateral direction (i.e., in the +/−Y direction) and the longitudinal direction (i.e., in the +/−X direction). As such, the plurality of channels 155 is established between the planer walls (i.e., the pair of opposing sidewalls 150b, 150c and the pair of opposing end walls 150d, 150e) of each one of the plurality of spacers 150. The plurality of channels 155 may be configured to allow for biaxial draining of the cooling fluid after impingement with the semiconductor device 110.

In some embodiments, the plurality of spacers 150 may be formed from a different material than the second mesh layer 140, such as, without limitation, solder. In this embodiment, at least a portion of the plurality of spacers 150 may be fixed to the second mesh layer upper surface 140b via soldering, transient liquid phase (TLP) bonding, or the like. For example, for a TLP bonding process, at least a portion of the plurality of spacers 150 may be fixed to the second mesh layer upper surface 140b by providing a low melting temperature material (e.g., tin or indium) adjacent to a high melting temperature material (e.g., copper, nickel, or aluminum) where the low melting temperature material has a lower melting temperature than the high melting temperature material. The low melting temperature material and the high melting temperature material may be provided via thin films and/or via individual particles or core/shell particles including the low and high melting temperature materials. The plurality of spacers 150 and the second mesh layer upper surface 140b may have a coating or layer of a high melting temperature material.

During TLP bonding, the plurality of spacers 150, the low and high melting temperature materials, and the second mesh layer upper surface 140b are subjected to a sintering temperature greater than the melting temperature of the low melting temperature material (e.g., between about 280° C. and about 350° C.) for a period of time. The sintering temperature causes the low melting temperature material to melt and diffuse into the high melting temperature material, thereby forming one or more intermetallic compound layers that bond the plurality of spacers 150 to the second mesh layer upper surface 140b and the plurality of spacers 150 to the semiconductor device 110 and form a spacer-like structure between the second mesh layer 140 and the semiconductor device 110. That is, in some embodiments, the plurality of spacers 150 may have a thickness that spaces apart the second mesh layer 140 from the semiconductor device 110 when the plurality of spacers 150 are set between the second mesh layer 140 and the semiconductor device 110. The one or more intermetallic compound layers (i.e., TLP bond layers) have a melting temperature that is greater than the sintering temperature. It should be understood that TLP bonding may be particularly used in instances where the semiconductor device 110 is a wide bandgap semiconductor device that operates at a relatively high temperature (e.g., at a temperature of about 200° C. or greater than about 200° C.) because the TLP bond layers adhere the components at relatively high temperatures better than a solder layer. The second mesh layer 140, being spaced apart from the semiconductor device 110, may provide a passage for draining cooling fluid such that heated cooling fluid that impinges on the first device surface 110a of the semiconductor device 110 does not transfer of latent heat back to other cooling fluid, as described herein.

As seen in FIG. 3, the offset cross-sectional view depicts the one of the opposing end walls 150e and the opposing sidewalls 150b, 150c. In this view, the passages or plurality of channels 155 (FIG. 5) are in front of the end wall 150e (i.e., in the −Y direction). As such, the plurality of channels 155 (FIG. 5) in this offset cross sectional are not illustrated. Instead, FIG. 3 depicts that the flow path of the cooling fluid as flowing through the jet channel 131, pore 138, pore 148 and between the opposing sidewalls 150b, 150c (i.e., between the planar surfaces) and in front of one of the opposing end walls 150e so to impinge on the first device surface 110a of the semiconductor device 110. The cooling fluid flow path is best seen in FIG. 5.

That is, each jet channel 131 includes an inside wall surface 208a, each pore 138 includes an inside wall surface 208b, and each pore 148 includes an inside wall surface 208c. The inside wall surfaces 208a, 208b, 208c may generally form the flow path of the cooling fluid. In some embodiments, at least a portion of the inside wall surfaces 208a, 208b, 208c may be coated or covered with a layer of an isolating material. For example, a first diameter D1 of the first pore 131 of the substrate layer 125, a perimeter P1 of the perimeter 138 of the first mesh 135, and a second diameter D2 of second pores 148 of the second mesh may be coated or covered with a layer of an isolating material. In some embodiments, the opposing sidewalls 150b, 150c, the opposing end walls 150d (FIG. 2A), 150e and the plurality of channels 155 may be coated or covered with a layer of an isolating material. The isolating material may generally be any material that is electrically non-conductive (e.g., an electrical insulator). Illustrative examples of isolating materials include, but are not limited to aluminum oxide, alumina, silicon dioxide ($SiO_2$), and/or the like.

With reference to FIG. 5, the perspective cross sectional view depicts that the cooling fluid depicted by an arrow 502 flows through the first opening 130a and out the second opening 130b of the jet channel 131 where the cooling fluid enters the first mesh layer 135 through the first inlet opening 138a and exits the first mesh layer 135 through the first outlet opening 138b. The cooling fluid then enters the second mesh layer 140 through the second inlet opening 148a and exits through the second outlet opening 148b. The cooling fluid continues through the second mesh layer 140 by flowing through the opening between the opposing sidewalls 150b, 150c and impinges on the first device surface 110a of the semiconductor device 110. After impingement, the cooling fluid now depicted by an arrow 504 exists the second mesh layer 140 by using the planar surfaces of the opposing end walls 150d, 150e as guides and following the plurality of channels 155. It should be appreciated that while the arrow 504 is depicted in only a single direction, the cooling fluid may exit the second mesh layer biaxially, using the planar surfaces of both the opposing end walls 150d, 150e and/or the planar surfaces of both the opposing sidewalls 150b, 150c.

Referring to the embodiments depicted in FIGS. 2A-5, the upper surface 150a of each one of the plurality of spacers 150 generally are in contact with the semiconductor device 110. In particular, the upper surface 150a of each one of the plurality of spacers 150 may be bonded to the first device surface 110a of the semiconductor device, the discrete metal layer or the metallization layer of the first device surface 110a of the semiconductor device 110. As such, the plurality of spacers 150 provide a mechanical, electrical, thermal joint, and/or the like between the second mesh layer 140 and the semiconductor device 110. The bonds between the second mesh layer 140 and the semiconductor device 110 may be formed through one of a variety of techniques, such as solder reflow, wave soldering, laser soldering, ultrasonic bonding, and/or thermosonic bonding. In some embodiments, the second mesh layer upper surface 140b may be directly bonded to the semiconductor device 110, the discrete metal layer of the semiconductor device 110 or the metallization layer of the semiconductor device 110. It should be appreciated that the plurality of spacers 150 may be used as a mounting position for the second mesh layer 140 to be deposited within the cooling chip structure 105, used to electrically connect the semiconductor device 110 to the second mesh layer 140, and/or a combination thereof.

Still referring to the embodiments in FIGS. 2A-5, the plurality of spacers 150 is depicted as rectangular. However, the shape of the plurality of spacers 150 may be any closed contoured regular shape such as a square, circle, triangle, diamond, hexagon, or the like. In some embodiments, the plurality of spacers 150 may be any irregular shape. Additionally, the quantity and location of the plurality of spacers 150 may be controlled depending on several factors, such as, for example, the amount of cooling needed, the velocity of the cooling fluid, and/or the like. Further, the plurality of spacers 150 generally are uniform in vertical height (i.e., in the +/−Z direction) and may generally have a corresponding width (i.e., in the +/−Y direction) depending on the column arrangement of the spacers. That is, as best seen in FIGS. 2A, 2B, and 5, the passages or the plurality of channels 155 align with the second plurality of pores 147 such that each second outlet opening 148b of each pore 148 may be centered in an intersection of the plurality of channels 155 to separate the plurality of spacers 150 into outer rows 202 and inner rows 204. Each one of the plurality of spacers 150 in the outer rows 202 generally have a matching width (i.e., in the +/−Y direction) and length (i.e., in the +/−X direction). Each one of the plurality of spacers 150 in the inner row have an increased width (i.e. the +/−Y direction) and length (i.e., in the +/−X direction) with reference to the each one of the plurality of spacers 150 in the outer rows 202.

As such, the plurality of channels 155 may be generally uniform based on the uniform width and length of the plurality of spacers 150. In embodiments, each spacer of the plurality of spacers 150 may not be uniform in placement of the spacer, in the vertical direction (i.e. in the +/−Z direction), in width (i.e., in the +/−Y direction) and/or in length (i.e., in the +/−X direction). Further, it should be appreciated that while nine spacers are depicted, this is merely illustrative and there may be more or fewer spacers.

Still referring to the embodiments of FIGS. 2A-5, the first mesh layer upper surface 135b of the first mesh layer 135 may be bonded to the second mesh layer lower surface 140a of the second mesh layer 140 to provide a mechanical, electrical, thermal joint, and/or the like between the first mesh layer 135 and the second mesh layer 140. The bonds between the first mesh layer 135 and the second mesh layer 140 may be formed through one of a variety of techniques, such as solder reflow, wave soldering, laser soldering, ultrasonic bonding, and/or thermosonic bonding. Still referring to the embodiments of FIGS. 1-5, the second plurality of pores 147 extend in the vertical direction (i.e., in the +/−Z direction) between the second mesh layer lower surface 140a and the second mesh layer upper surface 140b. The second plurality of pores 147 in the second mesh layer 140 have a shape defined by a circle. However, the shape of the second plurality of pores 147 may be any closed contoured regular shape such as a square, rectangle, triangle, diamond, hexagon, or the like. In some embodiments, the second plurality of pores 147 may be any irregular shape. Additionally, the quantity and location of the second plurality of pores 147 within the second mesh layer 140 may be controlled depending on several factors, such as, for example, the amount of cooling needed, the velocity of the cooling fluid, and/or the like.

Each pore 148 of the second plurality of pores 147 has a second inlet opening 148a and a second outlet opening 148b. The second inlet opening 148a is positioned adjacent to the first mesh layer 135 while the second outlet opening 148b is positioned adjacent to the plurality of spacers 150. The second plurality of pores 147 has a second inner diameter D2.

The second inner diameter D2 may be uniform between each pore 148 of the second plurality of pores 147. Further, the second plurality of pores 147 may have a uniform second inner diameter extending from the second inlet opening 148a to the second outlet opening 148b in the vertical direction (i.e., in the +/−Z direction). In some embodiments, the second inner diameter D2 may be not be uniform between each pore 148 of the second plurality of pores 147 and that some pores 148 may have varying second inner diameters D2. That is, some pores 148 may have varying second inner diameters D2 with respect to the other pores 148. In other embodiments, the second inner diameter D2 of second plurality of pores 147 extending from the second inlet opening 148a to the second outlet opening 148b in the vertical direction (i.e., in the +/−Z direction) may vary. That is, the second inner diameter D2 may be larger near the second inlet opening 148a with respect to the second outlet opening 148b. In this embodiment, it should be appreciated that the cooling fluid velocity may increase as the cooling fluid flows from the larger inner diameter near the second inlet opening 148a to the smaller diameter of the second outlet opening 148b.

Still referring to the embodiments in FIGS. 1-5, the first mesh layer 135 is coplanar and aligned with the second mesh layer 140 such that the first plurality of pores 137 is concentric with the second plurality of pores 147. Further, the first mesh layer 135 and the second mesh layer 140 are coplanar and aligned with the substrate layer 125 such that the first plurality of pores 137 and the second plurality of pores 147 are concentric with each one of the jet channels 130. Moreover, in this arrangement, the first inner diameter D1 of the one or more jet channels 130 is larger than the second inner diameter D2 of the second plurality of pores 147. Further, the perimeter and/or perimeter opening P1 of the first plurality of pores 137 is larger than the second inner diameter D2 of the second plurality of pores 147. As such, it should be appreciated that the inner diameters become smaller within the cooling chip structure 105 the closer to the semiconductor device 110. Therefore, it should be appreciated that the cooling fluid velocity increases as the cooling fluid flows from the larger first inner diameter D1 to the smaller second inner diameter D2 without decreasing the pressure, as discussed in greater detail below.

The one or more jet channels 130 are configured to direct the cooling fluid having a velocity through the substrate layer 125, through the first plurality of pores 137 and the second plurality of pores 147 such that the cooling fluid impinges on the first device surface 110a of the semiconductor device 110. As such, the concentric inner diameters D1, D2, and the perimeter opening P1 create a flow path for the cooling fluid. Further, as the cooling fluid is directed through the one or more jet channels 130 into the second inner diameter D2 of the second plurality of pores 147, the velocity of the cooling fluid increases due to the second inner diameter D2 being smaller than the first inner diameter D1 of the each one of the jet channels 130. That is, as the cooling fluid is directed through the flow path from the substrate layer 125 through the second mesh layer 140 the velocity of the cooling fluid increases. The closer the cooling fluid is in the flow path to the semiconductor device 110, the inner diameters become smaller, thus increasing the velocity of the directed cooling fluid without influencing the pressure of the system.

Therefore, this arrangement of aligned and concentric inner diameters and perimeter openings that become smaller as the flow path approaches the semiconductor device 110 provides an advantage of increasing the local jet velocity leading to an increase in thermal performance. As such, this arrangement increases the local velocity of the fluid impinging on the semiconductor device 110 without the need for additional components, such as pumps or the like, to increase the cooling fluid pressure.

Further, with reference to the embodiments as best seen in FIGS. 2A-2B, the plurality of spacers 150 form the plurality of channels 155 that assist in removing or draining of the cooling fluid after impingement with the semiconductor device 110. As such, the cooling fluid may exit the second mesh layer 140 biaxially, in both the longitudinal direction (i.e., in the +/−X direction) and the lateral direction (i.e., in the +/−Y direction) after impingement with the semiconductor device 110. That is, the cooling fluid may exit the cooling chip structure 105 from either open end of the plurality of spacers 150 (i.e. between the opposing end walls 150d, 150e and/or the opposing sidewalls 150b, 150c) using the plurality of channels 155 between the second mesh layer 140 and the semiconductor device 110 into a reservoir (not shown). It should be appreciated that this may not be the only exit path; there may be inlet and outlets pipes, and/or the like to assist in removing and/or cycling the cooling fluid through the cooling chip structure 105. Further, it should be understood that the reservoir may be fluidly coupled to a pump (not shown), which is in turn may be fluidly coupled to the jet channels 130 (FIGS. 2A-2B).

Figure 6:
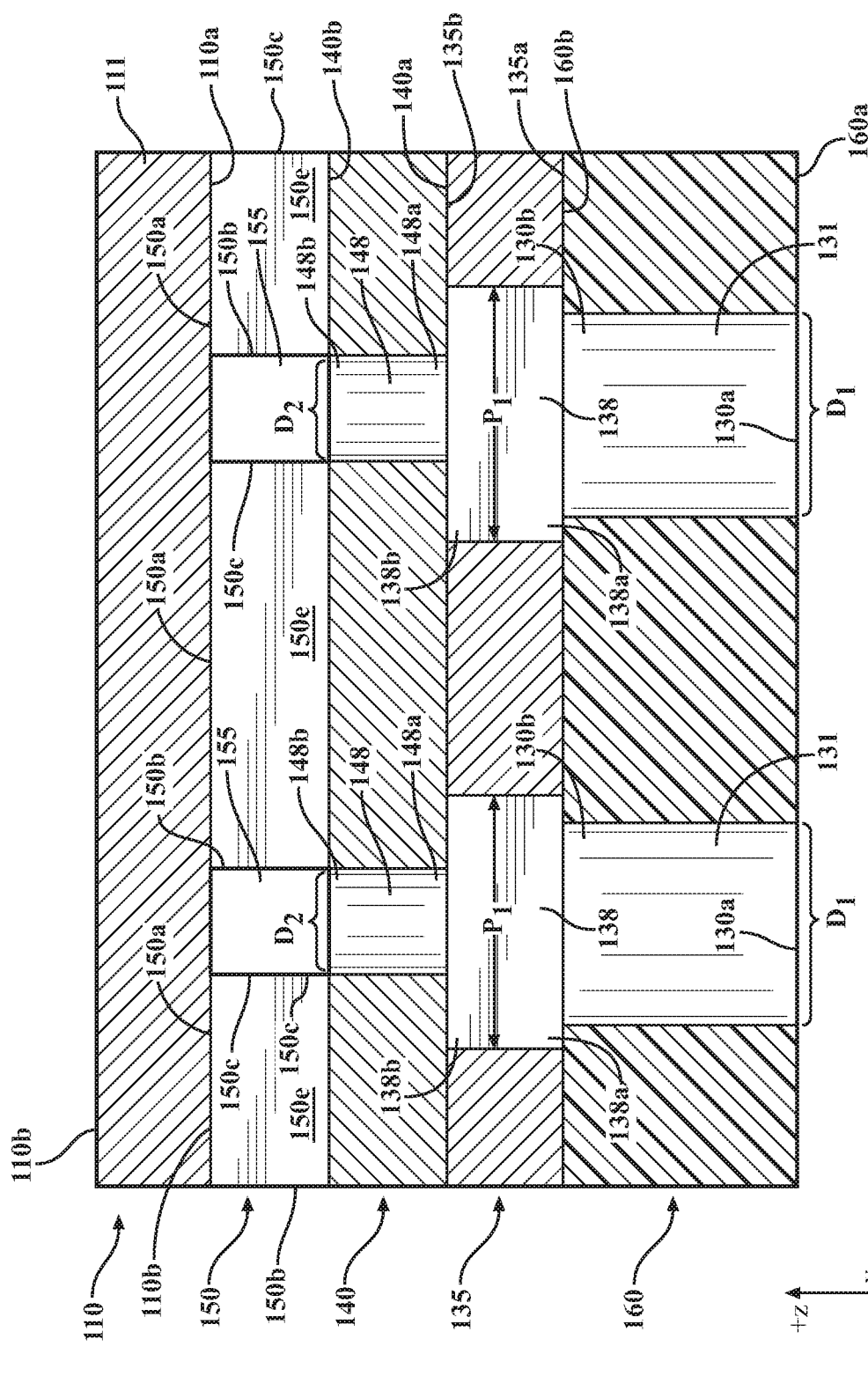
FIG. 6 schematically illustrates an offset cross-sectional view of an example electronics assembly having a manifold layer according to one or more embodiments shown or described herein.

In some embodiments, as shown in FIG. 6, the substrate layer 125 of the cooling chip structure 105 is a manifold layer 160. The manifold layer 160 is an electrical insulator such that, in this embodiment, the first mesh layer 135 is an electrode of the semiconductor device 110. That is, the manifold layer 160 material may include a polymer, a poly ether ketone, and/or the like such that the manifold layer 160 has insulating properties. The manifold layer 160 is positioned below the first mesh layer 135 in the vertical direction (i.e., in the +/−Z direction). In this arrangement, because the manifold layer 160 is the electrical insulator, the first mesh layer 135 may function as the electrode.

As such, the first mesh layer 135 electrically couples to the semiconductor device 110 and/or to a connected power source to facilitate electrical power transfer between the semiconductor device 110 and the external power source. An illustrative example of the first mesh layer 135 being electrically coupled to the semiconductor device 110 is where the connected power source is a vehicle power system (not shown). It should be understood that the first mesh layer 135 or electrode of the semiconductor device 110 described herein may be a single electrode (i.e., a sheet of electrically conductive material) or a patterned electrically conductive layer providing electrical connections for multiple signals (i.e., patterns defined by electrically conductive traces).

The manifold layer 160 include a first manifold layer surface 160a offset by a thickness opposite a second manifold layer surface 160b, and the one or more jet channels 130 disposed within the manifold layer 160 and extending the thickness vertically (i.e., in the +/−Z direction) between the first manifold layer surface 160a and the second manifold layer surface 160b. Each jet channel 131 of the one or more jet channels 130 has the first opening 130a at the first manifold layer surface 160a and the second opening 130b at the second manifold layer surface 160b. The one or more jet channels 130 have the first inner diameter D1.

The first mesh layer lower surface 135a may be bonded to the second manifold layer surface 160b by direct bonding to provide a mechanical, electrical, thermal joint, and/or the like between the manifold layer and the first mesh layer 135. In other embodiments, the first mesh layer lower surface 135a may be bonded to the second manifold layer surface via the first elongated members to provide a mechanical, electrical, thermal joint, and/or the like between the manifold layer and the first mesh layer 135. The bonds between the manifold layer 160 and the first mesh layer 135 may be formed through one of a variety of techniques, such as solder reflow, wave soldering, laser soldering, ultrasonic bonding, thermosonic bonding, and/or the like.

Figure 7:
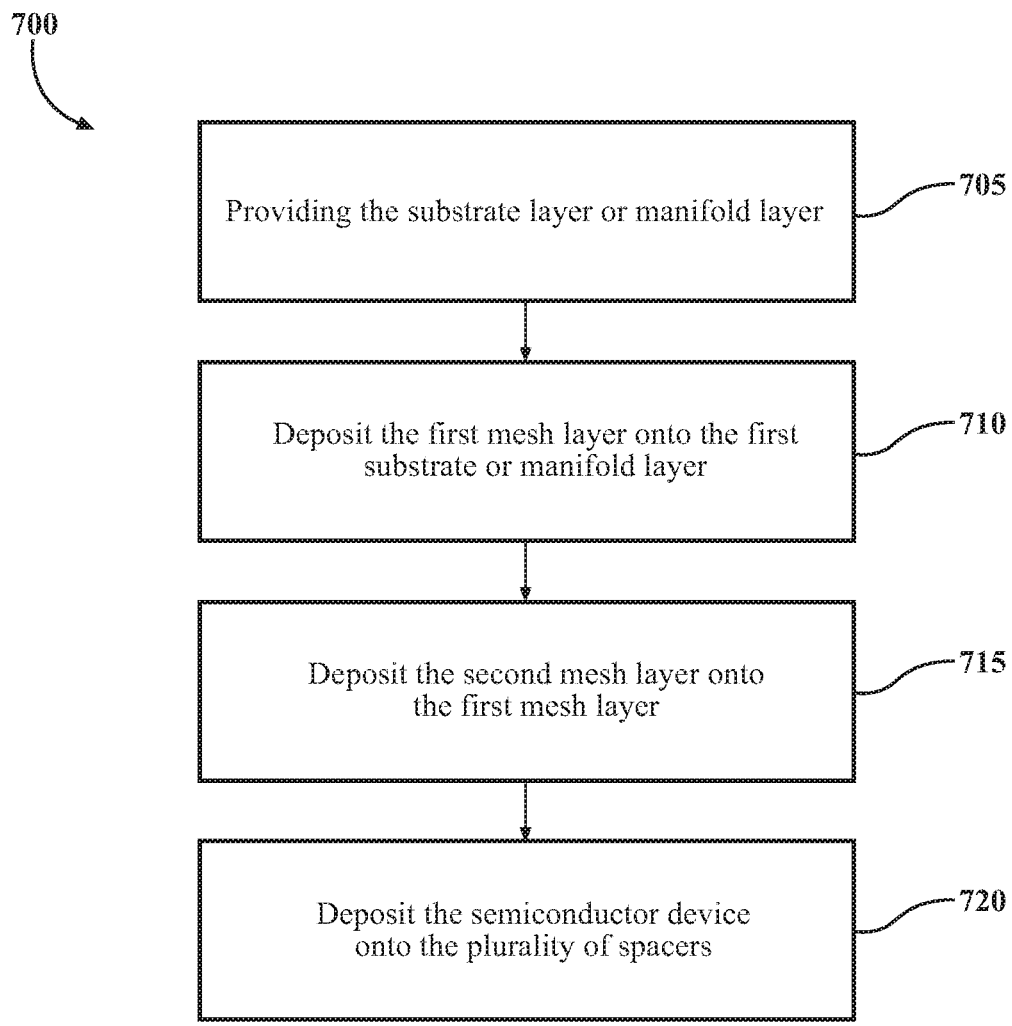
FIG. 7 depicts a flowchart of an illustrative method for forming the electronics assembly, according to one or more embodiments shown and described herein.

Referring now to FIGS. 2A and 7, a flowchart of an illustrative method 700 for forming the electronics assembly 100 is depicted. In embodiments, the method 700 of forming the electronics assembly 100 begins by providing the substrate layer 125 or the manifold layer 160 (FIG. 6) having the one or more jet channels 130 extending, in the vertical direction (i.e. the +/−Z direction), the thickness of the substrate layer 125 or manifold layer 160 (FIG. 6) at block 705.

Then the first mesh layer 135 is deposited onto the substrate layer 125 at block 710. The first mesh layer 135 is deposited such that the perimeter opening P1 (FIG. 3) of the first plurality of pores 137 align with the first inner diameter D1 of each jet channel 131 (FIG. 3) of the one or more jet channels 130. Further, the first mesh layer 135 is deposited onto the substrate layer 125 such that the perimeter opening P1 (FIG. 3) is concentric with the first inner diameter D1 (FIG. 3) of the one or more jet channels 130. The first mesh layer 135 may be deposited onto the substrate layer 125 by solder reflow, wave soldering, laser soldering, ultrasonic bonding, thermosonic bonding, physical vapor deposition, chemical vapor deposition, electrochemical deposition, molecular beam epitaxy, atomic layer deposition, and/or the like. In some embodiments, the material of the first mesh layer 135 may be directly deposited using methods such as physical vapor deposition, chemical vapor deposition, electrochemical deposition, molecular beam epitaxy, atomic layer deposition, and/or the like. However, if the first mesh layer 135 is a pre-fabricated mesh, the mesh may be created separately and then bonded. For example, the pre-fabricated mesh may be created separately by coating with a layer or another metal or metal alloy for bonding to the substrate layer 125 of the electronics assembly 100.

The second mesh layer 140 is deposited onto the first mesh layer upper surface 135b of the first mesh layer 135 at block 715. The second mesh layer 140 is deposited such that the second inner diameter D2 (FIG. 3) of the second plurality of pores 147 align with each pore 138 (FIG. 3) of the first polarity of pores 137. Further, the second mesh layer 140 is deposited onto the first mesh layer upper surface 135b of the first mesh layer 135 so that the second inner diameter D2 (FIG. 3) is concentric with the perimeter opening P1 (FIG. 3) of the second plurality of pores 137 and the first inner diameter D1 (FIG. 3) of the one or more jet channels 130. The second mesh layer 140 may be deposited onto the first mesh layer 135 by solder reflow, wave soldering, laser soldering, ultrasonic bonding, thermosonic bonding, physical vapor deposition, chemical vapor deposition, electrochemical deposition, molecular beam epitaxy, atomic layer deposition, and/or the like. It should be appreciated that for a deposition of the second mesh layer 140, the material of the second mesh layer 140 may be directly deposited using methods such as physical vapor deposition, chemical vapor deposition, electrochemical deposition, molecular beam epitaxy, atomic layer deposition, and/or the like. However, if the second mesh layer 140 is a pre-fabricated mesh, the mesh may be created separately and then bonded. For example, the build mesh may be created separately by coating with a layer of Sn or another metal or metal alloy for bonding to the semiconductor device 110 of the electronics assembly 100.

Further, the second mesh layer upper surface 140b of the second mesh layer 140 includes the plurality of spacers 150. The plurality of spacers 150 may be positioned between each pore 138 (FIG. 3) of the second plurality of pores so to not interfere with the flow of the cooling fluid. The plurality of spacers 150 may provide a structural position for the semiconductor device 110 or electrode to be deposited onto, as discussed in greater detail herein. The plurality of spacers 150 may be etched, machined, and/or the like into the second mesh layer 140 so to transverse the second mesh layer upper surface 140a and provide the plurality of channels 155 for draining the cooling fluid biaxially from the cooling chip structure 105.

The semiconductor device 110 or the electrode is deposited onto the plurality of spacers 150 at block 720. The semiconductor device 110 is deposited such that the first device surface 110a or the discrete metal layer of the semiconductor device 110 is in fluid communication with the second plurality of pores 147. As such, the first device surface 110a or the discrete metal layer of the semiconductor device 110 is also in fluid communication with the one or more jet channels 130 and the first plurality of pores 137. The semiconductor device 110 may be deposited onto the plurality of spacers 150 by solder reflow, wave soldering, laser soldering, ultrasonic bonding, thermosonic bonding, and/or the like.

It should now be understood that the electronics assembly includes a cooling chip structure having a substrate layer, a first mesh layer and a second mesh layer. The substrate layer incudes a plurality of jet channels that have a first inner diameter. The first mesh layer includes a first plurality of pores that have a perimeter opening. The second mesh layer includes a second plurality of pores that have a second inner diameter. The plurality of jet channels, the first plurality of pores, and the second plurality of pores are aligned and concentric with each other. The plurality of jet channels, the first plurality of pores, and the second plurality of pores create a fluid path for cooling fluid to be in fluid communication with the semiconductor device. In addition, the inner diameters become smaller as the fluid path becomes closer to the semiconductor device with the second plurality of pores having the smallest inner diameter. As such, as the cooling fluid is directed through the flow path, because the inner diameters become smaller, there is an increase in the velocity of the directed cooling fluid without influencing a pressure of the system.

What is claimed is:

1. An assembly comprising:
an electrode,
a substrate layer spaced apart from the electrode, the substrate layer comprising
one or more jet channels disposed within the substrate layer between a first surface and a second surface opposite the first surface, each jet channel having a first opening at the first surface and a second opening at the second surface,
a first mesh layer positioned between the electrode and the substrate layer and comprising a first plurality of pores that are each concentric with a corresponding second opening of the jet channels, and
a second mesh layer coupled to the first mesh layer between the electrode and the first mesh layer and comprising a second plurality of pores that are each concentric with a corresponding one of the first plurality of pores.

2. The assembly of claim 1, wherein:
each jet channel of the one or more jet channels has a first inner diameter;
the first plurality of pores has a perimeter having a perimeter opening;
the second plurality of pores has a second inner diameter; and
the second inner diameter is smaller than the perimeter opening of the first plurality of pores.

3. The assembly of claim 2, wherein the first inner diameter of each jet channel of the one or more jet channels are non-uniform.

4. The assembly of claim 2, wherein:
the jet channels are configured to direct a cooling fluid through the first plurality of pores and the second plurality of pores in a system vertical direction; and
a velocity of the cooling fluid increases as the cooling fluid passes through the first inner diameter to the perimeter opening and increases as the cooling fluid passes from the perimeter opening through the second inner diameter.

5. The assembly of claim 1, wherein at least one of the one or more jet channels, the first plurality of pores, and the second plurality of pores is coated with an isolating material.

6. The assembly of claim 1, wherein the first mesh layer is bonded to the substrate layer.

7. The assembly of claim 6, wherein:
the electrode has a first electrode surface and an opposite second electrode surface;
the second mesh layer is bonded to the first electrode surface of the electrode; and
the first mesh layer is bonded to the second mesh layer.

8. The assembly of claim 1, wherein:
the second mesh layer has a second mesh layer lower surface and an opposite second mesh layer upper surface; and
a plurality of spacers are formed from a portion of the second mesh layer upper surface of the second mesh layer.

9. The assembly of claim 8, wherein the plurality of spacers are spaced apart so to form a plurality of channels, the plurality of channels are configured to permit biaxial draining of a cooling fluid.

10. An electronics assembly comprising:
a semiconductor device; and
a cooling chip comprising:
a substrate layer spaced apart from the semiconductor device, the substrate layer comprising:
one or more jet channels disposed within the substrate layer between a first surface and a second surface opposite the first surface, each jet channel having a first opening at the first surface and a second opening at the second surface,
a first mesh layer positioned between the semiconductor device and the substrate layer and comprising a first plurality of pores that are each concentric with a corresponding second opening of the jet channels, and
a second mesh layer coupled to the semiconductor device and the first mesh layer and comprising a second plurality of pores that are each concentric with a corresponding one of the first plurality of pores.

11. The electronics assembly of claim 10, wherein the semiconductor device comprises a wide bandgap semiconductor device.

12. The electronics assembly of claim 10, wherein:
each jet channel of the one or more jet channels has a first inner diameter;
the first plurality of pores has a perimeter with a perimeter opening;
the second plurality of pores has a second inner diameter; and
the second inner diameter is smaller than the first inner diameter; and
the second inner diameter is smaller than the perimeter opening of the first plurality of pores.

13. The electronics assembly of claim 12, wherein the jet channels are configured to direct a cooling fluid through the first plurality of pores and the second plurality of pores in a system vertical direction so to impinge on the semiconductor device.

14. The electronics assembly of claim 13, wherein a velocity of the cooling fluid increases as the cooling fluid passes through the first inner diameter to the perimeter opening and increases as the cooling fluid passes from the perimeter opening through the second inner diameter.

15. The electronics assembly of claim 10, further comprising:
the second mesh layer having a second mesh layer lower surface and an opposite second mesh layer upper surface,
a plurality of spacers are formed from a portion of the second mesh layer upper surface of the second mesh layer, the plurality of spacers are spaced apart so to form a plurality of channels, the plurality of channels are configured to permit biaxial draining of a cooling fluid, wherein the second mesh layer is spaced apart from the semiconductor device by the plurality of spacers.

16. An assembly comprising:
a substrate layer comprising:
- one or more jet channels disposed within the substrate layer between a first surface and a second surface opposite the first surface, each jet channel having a first opening at the first surface and a second opening at the second surface,
- a first mesh layer coupled to the second surface and comprising a first plurality of pores that are each concentric with a corresponding second opening of the jet channels and smaller in diameter than the second opening,
- a second mesh layer coupled to the first mesh layer, the second mesh layer having an upper surface and a lower surface and comprising a second plurality of pores that are each concentric with a corresponding one of the first plurality of pores,
- a plurality of spacers formed from a portion of the upper surface, and
- a semiconductor device spaced apart from the substrate layer and coupled to the plurality of spacers.

17. The assembly of claim 16, wherein:
each jet channel of the one or more jet channels has a first inner diameter;
the first plurality of pores has a perimeter with a perimeter opening;
the second plurality of pores has a second inner diameter; and
the second inner diameter is smaller than the first inner diameter; and
the second inner diameter is smaller than the perimeter opening of the first plurality of pores.

18. The assembly of claim 17, wherein the jet channels are configured to direct a cooling fluid through the first plurality of pores and the second plurality of pores in a system vertical direction so to impinge on the semiconductor device.

19. The assembly of claim 17, wherein each jet channel of the one or more jet channels is configured to direct a cooling fluid through the first plurality of pores and the second plurality of pores in a system vertical direction such that a velocity of the cooling fluid directed through the first plurality of pores and the second plurality of pores increases as the cooling fluid passes through the first inner diameter to the perimeter opening and increases as the cooling fluid passes from the perimeter opening through the second inner diameter.

20. The assembly of claim 16, wherein the plurality of spacers are spaced apart so to form a plurality of channels, the plurality of channels are configured to permit biaxial draining of a cooling fluid.

* * * * *

UNITED STATES PATENT AND TRADEMARK OFFICE
CERTIFICATE OF CORRECTION

PATENT NO. : 11,121,061 B2  
APPLICATION NO. : 16/196780  
DATED : September 14, 2021  
INVENTOR(S) : Shailesh N. Joshi and Naoya Take Page 1 of 1

It is certified that error appears in the above-identified patent and that said Letters Patent is hereby corrected as shown below:

In the Specification

In Column 5, Line(s) 14, delete "AN" and insert --AlN--, therefor.

In Column 5, Line(s) 21, delete "AN" and insert --AlN--, therefor.

Signed and Sealed this  
Twenty-eighth Day of December, 2021

Drew Hirshfeld  
*Performing the Functions and Duties of the*  
*Under Secretary of Commerce for Intellectual Property and*  
*Director of the United States Patent and Trademark Office*